(12) United States Patent
Bock et al.

(10) Patent No.: US 10,548,229 B2
(45) Date of Patent: Jan. 28, 2020

(54) METHOD FOR PRODUCING A FOIL ARRANGEMENT AND CORRESPONDING FOIL ARRANGEMENT

(71) Applicant: CONTI TEMIC MICROELECTRONIC GMBH, Nuremberg (DE)

(72) Inventors: Johannes Bock, Erlangen (DE); Andreas Rebelein, Nuremberg (DE); Andreas Schulze, Lauf A. D. Peg./OT Neunhof (DE); Andreas Voegerl, Parsberg (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 0 days.

(21) Appl. No.: 15/314,524

(22) PCT Filed: May 27, 2015

(86) PCT No.: PCT/EP2015/061709
§ 371 (c)(1),
(2) Date: Nov. 29, 2016

(87) PCT Pub. No.: WO2015/185412
PCT Pub. Date: Dec. 10, 2015

(65) Prior Publication Data
US 2017/0215289 A1    Jul. 27, 2017

(30) Foreign Application Priority Data

Jun. 3, 2014 (DE) .................. 10 2014 210 483

(51) Int. Cl.
*B21C 37/00* (2006.01)
*H05K 3/46* (2006.01)
(Continued)

(52) U.S. Cl.
CPC ............. *H05K 3/4644* (2013.01); *C25D 3/12* (2013.01); *C25D 3/30* (2013.01); *C25D 3/48* (2013.01);
(Continued)

(58) Field of Classification Search
None
See application file for complete search history.

(56) References Cited

U.S. PATENT DOCUMENTS 4,626,462 A     12/1986   Kober et al.
4,756,795 A *   7/1988    Bakos ............... H05K 3/243
                                                  156/151
(Continued)

FOREIGN PATENT DOCUMENTS

DE            4026822 A1    2/1992
DE      102009058764 A1    6/2011
(Continued)

*Primary Examiner* — Seth Dumbris
(74) *Attorney, Agent, or Firm* — Laurence A. Greenberg; Werner H. Stemer; Ralph E. Locher

(57) ABSTRACT

A method for producing a foil arrangement includes structuring a conductive foil to be applied or applied onto a support foil upper side of a support foil and coating a conductive foil upper side of the structured conductive foil with a protective layer. A cover foil is laminated onto the support foil upper side and onto a protective layer upper side of the protective layer after the coating step.

7 Claims, 1 Drawing Sheet

(51) Int. Cl.
*C25D 3/12* (2006.01)
*C25D 3/30* (2006.01)
*C25D 3/48* (2006.01)
*C25D 3/56* (2006.01)
*C25D 3/60* (2006.01)
*C25D 3/62* (2006.01)
*C25D 7/06* (2006.01)
*H05K 3/24* (2006.01)
*H05K 3/28* (2006.01)
*H05K 1/02* (2006.01)

(52) U.S. Cl.
CPC .............. *C25D 3/562* (2013.01); *C25D 3/60* (2013.01); *C25D 3/62* (2013.01); *C25D 7/0614* (2013.01); *H05K 3/241* (2013.01); *H05K 3/285* (2013.01); *H05K 1/028* (2013.01); *H05K 2201/032* (2013.01); *H05K 2201/0355* (2013.01); *H05K 2203/0723* (2013.01); *Y10T 428/12431* (2015.01); *Y10T 428/12438* (2015.01)

(56) References Cited

U.S. PATENT DOCUMENTS

| | | | |
|---|---|---|---|
| 5,536,908 A * | 7/1996 | Etchells | H05K 3/062 174/250 |
| 5,590,465 A | 1/1997 | Santo | |
| 5,886,309 A * | 3/1999 | Hosogai | H04Q 1/145 200/1 R |
| 5,923,115 A * | 7/1999 | Mohr, III | H01L 41/0475 310/334 |
| 6,015,607 A * | 1/2000 | Fraivillig | B32B 7/12 428/214 |
| 6,492,599 B1 * | 12/2002 | Sugihara | G01R 1/07314 174/255 |
| 8,445,621 B2 | 5/2013 | Sunaga et al. | |
| 2006/0108145 A1 | 5/2006 | Ueno | |
| 2007/0190847 A1 | 8/2007 | Ichino et al. | |
| 2007/0227761 A1 | 10/2007 | Tuominen et al. | |
| 2008/0230263 A1 * | 9/2008 | En | C25D 3/38 174/262 |
| 2009/0007421 A1 | 1/2009 | Chen et al. | |
| 2009/0246554 A1 * | 10/2009 | Furukawa | H05K 3/025 428/656 |
| 2009/0291319 A1 * | 11/2009 | Nagatani | C23C 30/00 428/607 |
| 2010/0096168 A1 * | 4/2010 | Ohtsuki | B23K 26/0661 174/254 |
| 2010/0116528 A1 * | 5/2010 | Shim | C25D 5/12 174/255 |
| 2013/0015572 A1 | 1/2013 | Ostmann et al. | |
| 2014/0098501 A1 * | 4/2014 | Kawaguchi | H05K 1/0277 361/750 |
| 2015/0203715 A1 | 7/2015 | Kotake et al. | |

FOREIGN PATENT DOCUMENTS

| | | | |
|---|---|---|---|
| EP | 0175045 A2 | 3/1986 | |
| EP | 0321067 A1 | 6/1998 | |
| GB | 2247361 A * | 2/1992 | ......... H05K 3/4069 |
| JP | S62145374 U | 9/1987 | |
| JP | H06216487 A | 8/1994 | |
| JP | H0818203 A | 1/1996 | |
| JP | H08501185 A | 2/1996 | |
| JP | H08213729 A | 8/1996 | |
| JP | 2006319269 A | 11/2006 | |
| JP | 2009068002 A | 4/2009 | |
| JP | 2010248473 A | 11/2010 | |
| WO | 9324313 A1 | 12/1993 | |

* cited by examiner

METHOD FOR PRODUCING A FOIL ARRANGEMENT AND CORRESPONDING FOIL ARRANGEMENT

TECHNICAL FIELD

The present invention relates to a method for producing a foil arrangement and to a corresponding foil arrangement.

TECHNICAL BACKGROUND

There are already a series of methods for embedding semiconductor structural parts into flexible substrates or foil arrangements which in part are already used in manufacturing.

US 2007/0227761 A1 describes, for example, a method for embedding electronic components, in which the electronic component is placed onto a foil arrangement composed of a conductive layer and carrier foil by means of an adhesive layer and is surrounded by an insulating compound.

In the method described in said document, the carrier layer is removed, and holes are drilled from the side of the conductive layer in order to produce a connection with the bumps or the contact areas of the at least one electronic structural part.

In the method described in said document, the conductive layer is then provided with a metalization, and both are structured according to the specifications.

DE 102009058764 A1 relates to a method for producing an electronic subassembly, in which at least one electronic structural part is at least partially embedded in an insulating material.

The method described in said document comprises the following steps:
providing a foil arrangement comprising at least one conductive layer and a carrier layer, structuring the conductive layer of the foil arrangement in such a manner as to produce openings for receiving bumps which are connected to the contact areas of the at least one tip electronic structural part.

The method described in said document furthermore comprises applying an adhesive layer to the conductive layer provided with openings, placing the at least one structural part onto the foil arrangement, depositing a metalization layer on the side of the conductive layer with the exposed bumps.

SUMMARY OF THE INVENTION

The present invention is therefore based on the object of providing an improved method for producing a foil arrangement.

The object is achieved by the features of the independent claims.

Accordingly, according to a first aspect of the present invention, provision is made of a method for producing a foil arrangement, wherein the method comprises the following method steps: structuring a conductive foil applied or to be applied to a carrier foil top side of a carrier foil; coating a conductive foil top side of the structured conductive foil with a protective layer; and laminating a cover foil onto the carrier foil top side and onto a protective layer top side of the protective layer after the coating.

Expressed in other words, the conductive foil can be structured before or after it is applied. Furthermore, the conductive foil can be coated before or after it is applied.

According to a second aspect of the present invention, provision is made of a foil arrangement, for example producible by a method according to one embodiment of the first aspect, wherein the foil arrangement comprises: a carrier foil having a carrier foil top side; a conductive foil applied to the carrier foil top side and having a structuring; a protective layer applied to a conductive foil top side and having a protective layer top side; and a cover foil laminated onto the carrier foil top side and the protective layer top side.

Advantageous configurations of the invention are identified in the dependent claims.

The concept on which the invention is based lies in the fact that, during the production sequence for the foil, the surface coating of the copper is applied in a production step to be carried out before the lamination of the cover foil, in order to protect polyimide conductor foils from corrosion.

If the surface coating is advantageously applied before the lamination of the cover foil, the cover foil and surface coating can be formed so as to overlap, and there is no longer a point of attack for corrosion of the underlying conductive foil, preferably copper.

Furthermore, the lamination may if appropriate also be used for printed circuit boards, for instance printed circuit boards made of an electrically insulating material with conductive connections (conductor tracks) adhering thereto. Fiber-reinforced plastic can be used as the insulating material. The conductor tracks can be etched from a thin layer of copper.

The foil arrangement can be in the form of a flexible printed circuit board, for instance based on polyimide foils.

The flexible circuits which are built up using the foil arrangement can be used in a space-saving manner, through folding, in extremely narrow structures, for instance in cameras, video cameras or else smartphones or gearbox control systems, in particular installed or fitted in or on the gearbox.

Flexible connections for permanent loading, for example in ink-jet printers, can likewise be formed as a polyimide foil printed circuit board.

In one advantageous embodiment, it is provided that the coating comprises electroplating of the conductive foil top side.

Permanent protection against corrosion can thereby be advantageously provided in a reliable manner.

In a further preferred embodiment, it is provided that, before the structuring of the conductive foil, the conductive foil is adhesively bonded to the carrier foil.

This makes it possible in a simple manner to connect the conductive foil and the carrier foil by means of an adhesive bond.

In a further preferred embodiment, it is provided that the foil arrangement is populated with structural parts after the lamination.

Assembly can thereby be effected in an advantageous manner.

In a further preferred embodiment, it is provided that an overlap region is formed during the coating of the structured conductive foil with the protective layer.

Tightly sealed corrosion protection can thereby be provided in an advantageous manner.

In a further preferred embodiment, it is provided that the conductive foil comprises a metal, preferably copper or a copper alloy.

In a further preferred embodiment, it is provided that the protective layer comprises an electroplated layer. By way of example, the protective layer can also be applied in the form of a hot air metallization or a hot air leveling (HAL for short), or the protective layer is formed by means of a chemical method, for example chemical metallization.

In the HAL process, by way of example, circuit boards are clamped in a guide or clamp and dipped into a hot tin bath.

In a further preferred embodiment, it is provided that the electroplated layer comprises gold or a gold alloy, nickel or a nickel alloy, tin or a tin alloy, or a combination of nickel and gold (NiAu) or a combination of nickel, palladium and gold (ENEPAG=electroless nickel, electroless palladium, autocatalytic gold; ENEPIG=electroless nickel, electroless palladium, immersion gold).

In a further preferred embodiment, it is provided that the carrier foil comprises a polyethylene or a polyimide, the carrier foil preferably comprising polybismaleimide, polybenzimidazole, polyoxadiazobenzimidazole, polyimide sulfone or polymethacrylimide.

The described configurations and developments can be combined with one another as desired.

Further possible configurations, developments and implementations of the present invention also include combinations which have not been explicitly mentioned of features of the invention described above or hereinbelow with respect to the exemplary embodiments.

BRIEF DESCRIPTION OF THE DRAWINGS

The accompanying drawings are intended to provide a further understanding of the embodiments of the present invention. They illustrate embodiments and, in conjunction with the description, serve to explain concepts of the present invention.

Other embodiments and many of the advantages mentioned become apparent with a view to the drawings. The elements shown in the drawings are not necessarily shown true to scale in relation to one another.

In the drawings:

FIG. 1 shows a schematic illustration of a foil arrangement according to one embodiment of the present invention;

FIG. 2 shows schematic illustration of a foil arrangement according to a further embodiment of the present invention;

FIG. 3 shows a schematic illustration of a foil arrangement according to a further embodiment of the invention;

FIG. 4 shows a schematic illustration of a foil arrangement according to a further embodiment of the invention;

FIG. 5 shows a schematic illustration of a flow chart of a method for producing a foil arrangement according to a further embodiment of the invention; and FIG. 6 shows a schematic illustration of a foil arrangement for explaining the invention.

DETAILED DESCRIPTION OF EXEMPLARY EMBODIMENTS

In the figures of the drawings, identical reference signs denote identical or functionally identical elements, structural parts, components or method steps, unless stated to the contrary.

Figure 1:
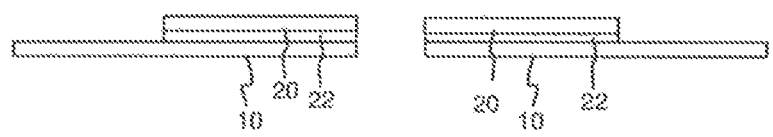

FIG. 1 shows a schematic illustration of a foil arrangement according to one embodiment of the present invention.

A carrier foil 10 has, for example, a carrier foil top side 11. A conductive foil 20 which is applied to the carrier foil top side 11 and has been adhesively bonded, for example, by means of an adhesive layer 22 is structured S1.

Figure 2:
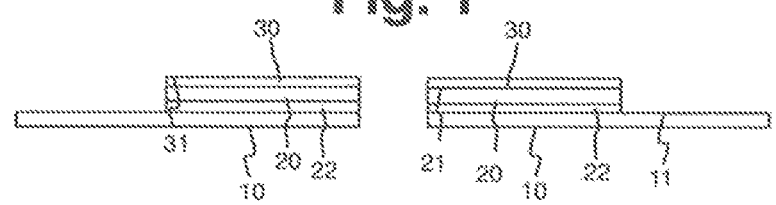

FIG. 2 shows a schematic illustration of a foil arrangement according to one embodiment of the present invention.

Proceeding from the degree of completion of the foil arrangement as shown in FIG. 1, in FIG. 2 a conductive foil top side 21 of the structured conductive foil 20 is coated S2 with a protective layer 30; this can be performed by means of electroplating.

The further reference signs in FIG. 2 have already been explained in the previous descriptions of the figures and therefore will not be described further.

Figure 3:
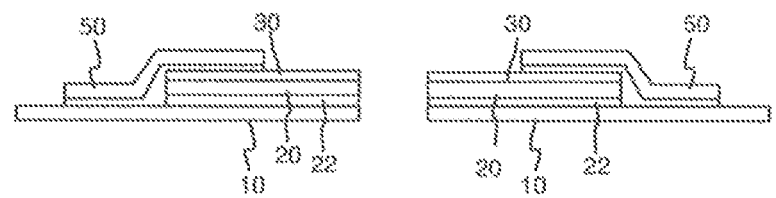

FIG. 3 shows a schematic illustration of a foil arrangement according to one embodiment of the present invention.

Furthermore, proceeding from the degree of completion of the foil arrangement as shown in FIG. 2, a cover foil 50 is laminated S3 onto the carrier foil top side 11 and onto a protective layer top side 31 of the protective layer 30 after the coating S2.

The further reference signs in FIG. 3 have already been explained in the previous descriptions of the figures and therefore will not be described further.

Figure 4:
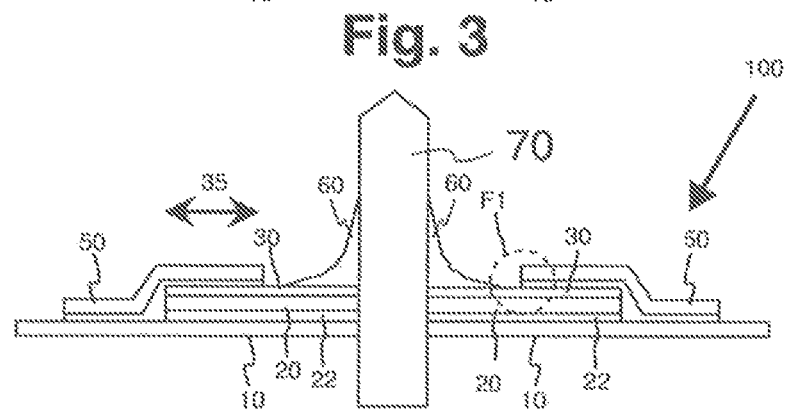

FIG. 4 shows a schematic illustration of a foil arrangement according to one embodiment of the present invention.

A connection pin 70 of an electronic structural part can be connected to the structured conductive foil 20 by a soldered connection 60, for example, with an overlap region 35 being formed during the coating S3 of the structured conductive foil 20 with the protective layer 50.

FIG. 4 shows mounting in the form of lead-through mounting (through-hole technology, THT; pin-in-hole technology, PIH). The lead-through mounting is characterized in that the structural elements have wire connections ("wired structural elements").

During mounting, for example, these are inserted through contact holes in the printed circuit board and then connected to the conductor track by soldering, manual soldering, wave soldering or selective soldering.

However, the foil arrangement 100 can also be used in further methods of mounting in mounting and connection technology, for instance in surface mounting (surface-mounting technology, SMT).

The overlap region 35 makes it possible for the conductive foil 20 to be covered completely with the protective layer 30 at the corrosion regions F1.

The further reference signs in FIG. 4 have already been explained in the previous descriptions of the figures and therefore will not be described further.

Figure 5:
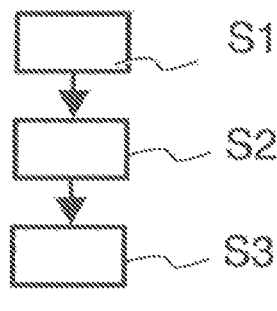

FIG. 5 shows a schematic illustration of a flow chart of a method for producing a foil arrangement according to a further embodiment of the invention.

As a first method step, structuring S1 of a conductive foil 20 applied to a carrier foil top side 11 of a carrier foil 10 is affected.

As a second method step, coating S2 of a conductive foil top side 21 of the structured conductive foil 20 with a protective layer 30 is affected.

By way of example, a nickel-phosphorus layer can be deposited chemically—without external current—as the protective layer 30.

Furthermore, an electrolytically deposited nickel-phosphorus layer can be applied as the protective layer 30.

For applications on conductive foils which are subject to high mechanical loading, nickel-phosphorus layers having a thickness of, for example, 2 to 4 µm are deposited (electrolytically or chemically).

As a third method step, laminating S3 of a cover foil 50 onto the carrier foil top side 11 and onto a protective layer top side 21 of the protective layer 30 is effected after the coating S2.

The carrier foil 10 can be in the form of a polyethylene or in the form of a polyimide foil and can have a polyimide thickness of up to 25 µm, up to 50 µm, up to 100 µm or up to 500 µm.

The carrier foil 10 can also comprise polybismaleimide (PBMI), polybenzimidazole (PBI), polyoxadiazobenzimidazole (PBO), polyimide sulfone (PISO), polymethacrylimide (PMI) or polyether imides (PEI) or polyamide imides (PAI).

The conductive foil 20 can be in the form of a copper foil, on one side or both sides with a thickness of 18 µm, 35 µm, 70 µm or 140 µm in the form of rolled copper, suitable for dynamic flexible applications, or in the form of electrolytically deposited copper.

This advantageously makes it possible to achieve reduced elongation at break.

As adhesive systems, it is possible to use acrylic adhesives or epoxy adhesives. Metallic cover layers which have been produced by electroplating or chemically and are composed of tin, gold, nickel, copper, chromium, palladium or alloy layers such as nickel-phosphorus (chemical nickel) also bring about corrosion protection through the formation of a protective layer 30 on the conductive foil 20.

The protective action in the case of metal layers is based on their property of themselves not corroding (precious metals or, for example in the case of nickel, spontaneous self-passivation) or else on passivation of the base metal through the formation of a dense oxide layer on the surface which serves as corrosion protection.

Figure 6:
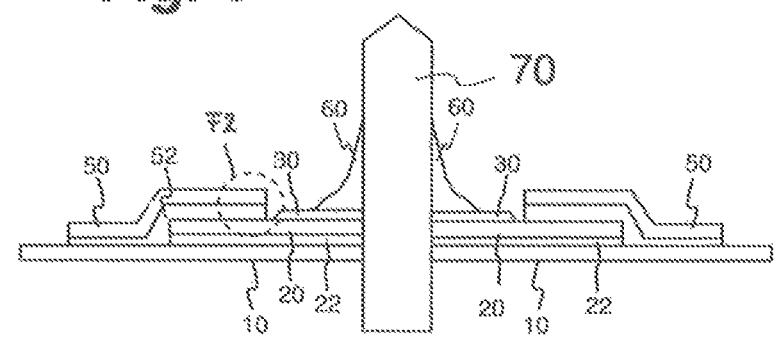

FIG. 6 shows a schematic illustration of a foil arrangement for explaining the invention.

No overlap region 35 has been formed during the coating of the structured conductive foil of the foil arrangement shown in FIG. 6 with the protective layer 50.

Consequently, the conductive foil 20 is not covered completely with the protective layer 30 at the corrosion regions F2.

The further reference signs in FIG. 6 have already been explained in the previous descriptions of the figures and therefore will not be described further.

Although the present invention has been described above with reference to preferred exemplary embodiments, it is not limited thereto, but instead can be modified in variety of ways.

In particular, the invention can be changed or modified in various ways without departing from the core of the invention.

The invention claimed is:

1. A foil configuration, comprising:
a carrier foil having a carrier foil top side;
a conductive foil applied to said carrier foil top side and having a structuring and a conductive foil top side;
a protective layer applied to said conductive foil top side and having a protective layer top side;
a cover foil laminated onto said carrier foil top side at a location in which said protective layer is not between said cover foil and said carrier foil top side, said cover foil laminated onto said protective layer top side at another location; and
a connection pin extending through a hole formed in said carrier foil, said conductive foil, and said protective layer, said connection pin connected to said conductive foil;
said hole formed in said carrier foil, said conductive foil, and said protective layer having only one conductive element extending completely therethrough;
said conductive element being said connection pin; and
said protective layer top side facing away from said carrier foil, said protective layer top side including a portion adjacent said connection pin, and said portion of said protective layer top side adjacent said connection pin being not covered by said cover foil.

2. The foil configuration according to claim 1, wherein said conductive foil contains a metal.

3. The foil configuration according to claim 1, wherein said protective layer includes an electroplated layer.

4. The foil configuration according to claim 3, wherein said electroplated layer contains at least one of gold, a gold alloy, nickel, a nickel alloy, tin or a tin alloy.

5. The foil configuration according to claim 2, wherein said carrier foil contains a polyethylene or a polyimide.

6. The foil configuration according to claim 1, wherein said conductive foil contains a metal selected from the group consisting of copper and a copper alloy.

7. The foil configuration according to claim 2, wherein said carrier foil contains polybismaleimide, polybenzimidazole, polyoxadiazobenzimidazole, polyimide sulfone or polymethacrylimide.

* * * * *